United States Patent
Fox et al.

(10) Patent No.: US 7,848,175 B2
(45) Date of Patent: Dec. 7, 2010

(54) CALIBRATION OF MEMORY DRIVER WITH OFFSET IN A MEMORY CONTROLLER AND MEMORY DEVICE INTERFACE IN A COMMUNICATION BUS

(75) Inventors: Benjamin A Fox, Rochester, MN (US);
William P Hovis, Rochester, MN (US);
Thomas W Liang, Rochester, MN (US);
Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 12/361,976

(22) Filed: Jan. 29, 2009

(65) Prior Publication Data

US 2010/0188919 A1    Jul. 29, 2010

(51) Int. Cl.
*G11C 8/00* (2006.01)

(52) U.S. Cl. .................................. 365/230.06; 365/201

(58) Field of Classification Search .................. 714/734
See application file for complete search history.

(56) References Cited

U.S. PATENT DOCUMENTS

| | | | | |
|---|---|---|---|---|
| 6,330,194 B1* | 12/2001 | Thomann et al. | ....... | 365/189.05 |
| 6,762,614 B2* | 7/2004 | Rearick et al. | ............. | 324/763 |
| 7,514,954 B2* | 4/2009 | Kim et al. | ..................... | 326/30 |
| 7,515,487 B2* | 4/2009 | Seo et al. | ............... | 365/189.09 |

* cited by examiner

*Primary Examiner*—Tan T. Nguyen
(74) *Attorney, Agent, or Firm*—Toler Law Group

(57) ABSTRACT

A method and system are provided for coupling a DRAM and a memory controller during driver training to reduce mismatches by controlling impedances within the system environment. The memory device, which is typically the device initializing a bit level voltage on a data net, is adjusted through altering what appears to be the reference voltage value to the memory device. A current driven to the memory device is varied in small increments while impedance training is rerun until a desired value is achieved to set the 0 level voltage on the data net.

20 Claims, 3 Drawing Sheets

CALIBRATION OF MEMORY DRIVER WITH OFFSET IN A MEMORY CONTROLLER AND MEMORY DEVICE INTERFACE IN A COMMUNICATION BUS

RELATED APPLICATIONS

The present application relates to co-pending U.S. patent applications, entitled "Setting Controller VREF in a Memory Controller and Memory Device Interface in a Communication Bus" U.S. patent application Ser. No. 12/361,719, filed Jan. 29, 2009, "Setting Controller Termination in a Memory Controller and Memory Device Interface in a Communication Bus" U.S. patent application Ser. No. 12/361,836, filed Jan. 29, 2009, "Setting Memory Controller Driver to Memory Device Termination Value in a Communication Bus" U.S. patent application Ser. No. 12/361,577, filed Jan. 29, 2009, "Setting Memory Device Vref in a Memory Controller and memory Device Interface in a Communication Bus" U.S. patent application Ser. No. 12/361,592, filed Jan. 29, 2009, and "Setting Memory Device Termination in a Memory Device and Memory Controller Interface in a Communications Bus" U.S. patent application Ser. No. 12/361,602, filed Jan. 29, 2009, by the present inventors, Paul W. Rudrud, Thomas W. Liang, Benjamin A. Fox, and William P. Hovis. The co-pending applications are filed concurrently herewith, and are incorporated by reference in their entireties.

FIELD OF THE INVENTION

The present invention relates to a system and method in which a memory device such as a DRAM and a memory controller are coupled during memory driver training to reduce mismatches by controlling impedance within the system environment. The invention further relates to coupling components on a shared electrical bus through driver adjustment with training necessary to remove offset issues.

BACKGROUND OF THE INVENTION

In an electrical communication bus in which a memory controller is coupled with a memory device such as a GDDR3 DRAM memory, the DRAMs are designed to train their drive impedance and termination impedance against a reference resistor. However, process variations and resolution may cause variations in the final DRAM training values. The variations may occur within a memory controller coupled to the DRAM if it trains in a similar manner, thereby causing a mismatch in DRAM and controller impedances.

Such mismatches may cause timing offsets due to the reference voltages not being properly aligned to the resulting data eye. The problem can occur specifically in a GDDR3 interface from a memory controller to a GDDR3 memory device. However, the problem also occurs in a number of other system and sub-system electrical communication buses. The offsets may result in reduced timing margins in such situations.

Accordingly, what is needed is an arrangement which couples a memory device and its memory controller during memory driver training to reduce mismatches through calibration of a DRAM driver with the memory controller.

SUMMARY OF THE INVENTION

The present invention provides for a memory device and a memory controller, typically a DRAM memory device, and more particularly, a GDDR3 memory device, to be coupled during driver training to reduce mismatches by adjusting a voltage to the reference resistors on a DRAM device making the DRAM driver impedance vary accordingly to yield improvements in timing margins.

An aspect of the invention may provide a method of calibrating the driver of a memory device connected to a memory controller in an electrical communication bus. The memory device is connected in an electrical communication bus with a corresponding memory controller during training of the drive impedance of the memory device. The memory device driver initializes a 0 bit level voltage on the communication bus (data net). The 0 bit level voltage is applied to a test path of the memory controller. The 0 bit level voltage is adjusted in the memory controller to arrive at a predetermined level. The predetermined level voltage results in a current which is applied to a resistor arrangement connected to the memory device so that the predetermined level voltage set at the memory controller is set as the 0 bit level voltage on the communication bus.

In a more specific aspect, the predetermined level voltage is used to set a current supplied to a resistor arrangement at the memory device. The memory device is preferably a GDDR3 DRAM.

Another aspect of the invention includes a coupled memory controller and memory device in an electrical communication bus. A connection is provided between a memory interface of the memory controller to the memory device, connecting a driver of the memory device to the memory controller for having the driver of the memory device initialize a 0 bit level voltage on the connection. A resistor arrangement is connected to a test path of the memory controller. The test path is connected to the connection between the memory device and the memory controller, as well as to a resistor arrangement of the memory device for adjusting the 0 bit level voltage to a predetermined level. That predetermined voltage is applied to the memory device during training.

These and other advantages and features that characterize the invention are set forth in the claims annexed hereto and forming a further part hereof. However, for a better understanding of the invention, and of the advantages and objectives obtained through its use, reference should be made to the drawings and to the accompanying descriptive matter in which they are described exemplary embodiments of the invention.

DETAILED DESCRIPTION OF THE INVENTION

Embodiments consistent with the invention may capitalize on the ability to couple a memory device such as a DRAM and a memory controller during driver training to reduce mismatches by adjusting a voltage to the reference resistors used in driver training on the DRAM device making the driver either weaker or stronger as needed to yield improvements in timing margins. In more general terms, coupling the components on a shared electrical bus through level adjustment removes known offset issues. While embodiments of the invention are described specifically for a GDDR3 interface from a memory controller to a GDDR3 memory device, the system and method described may be applied to any number of system and sub-system electrical communication buses. Optionally, the speed at which the interface operates may be improved as a result of employing the system and method described.

Figure 1:
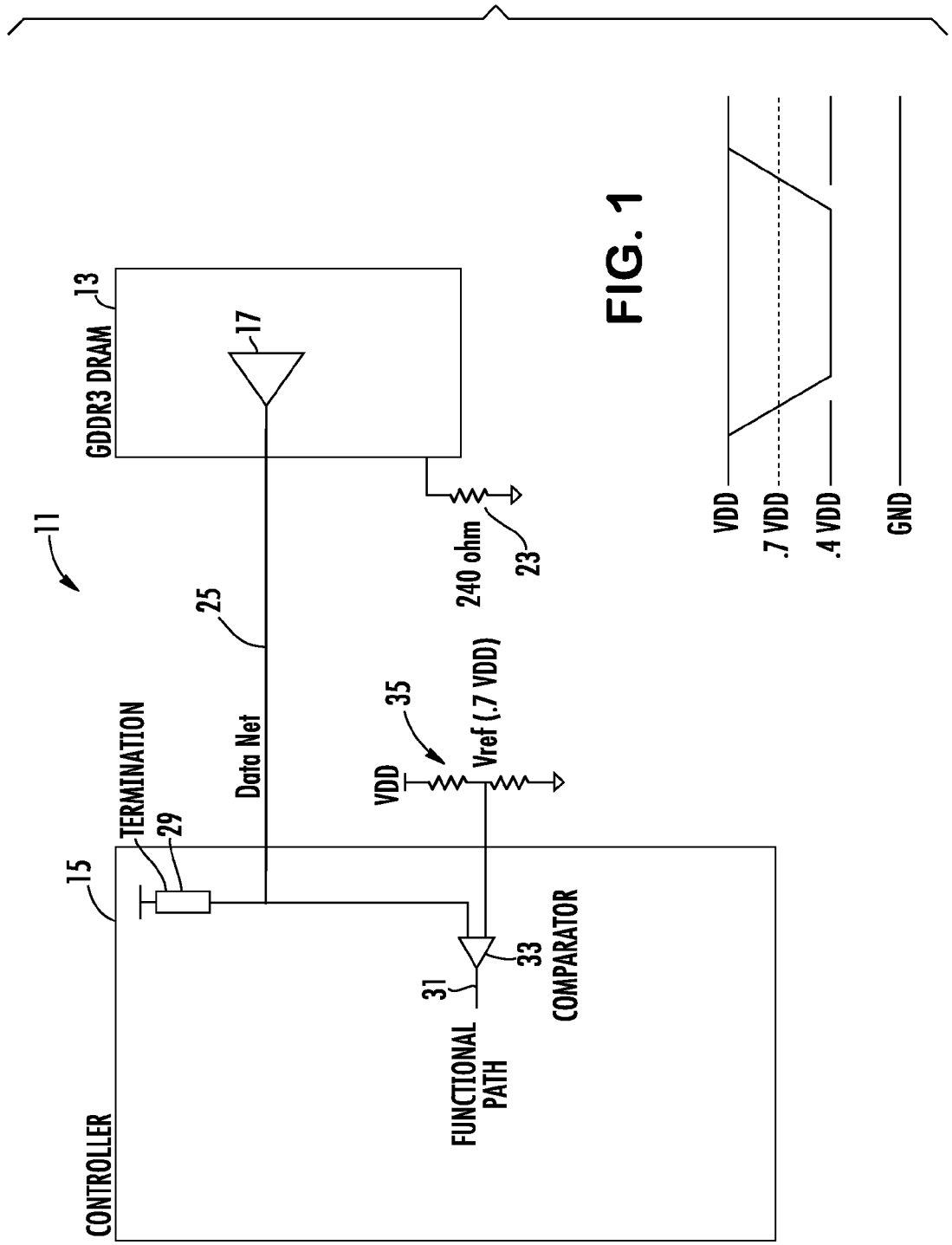
FIG. 1 is a schematic diagram illustrating a particular prior art interface in an electrical communication bus between a memory controller and a memory device, such as a GDDR3 DRAM.

Turning more particularly to the drawings, FIG. 1 shows a typical GDDR3 interface system 11. More particularly, a memory controller 15 is connected through a data net 25 to a GDDR3 DRAM 13. A comparator 33 connects to a functional path 31 in the memory controller 15. The data net 25 is connected to the comparator 33, and a termination device 29. A reference voltage for the controller 15 is typically provided through a voltage divider pair of resistors 35.

Figure 2:
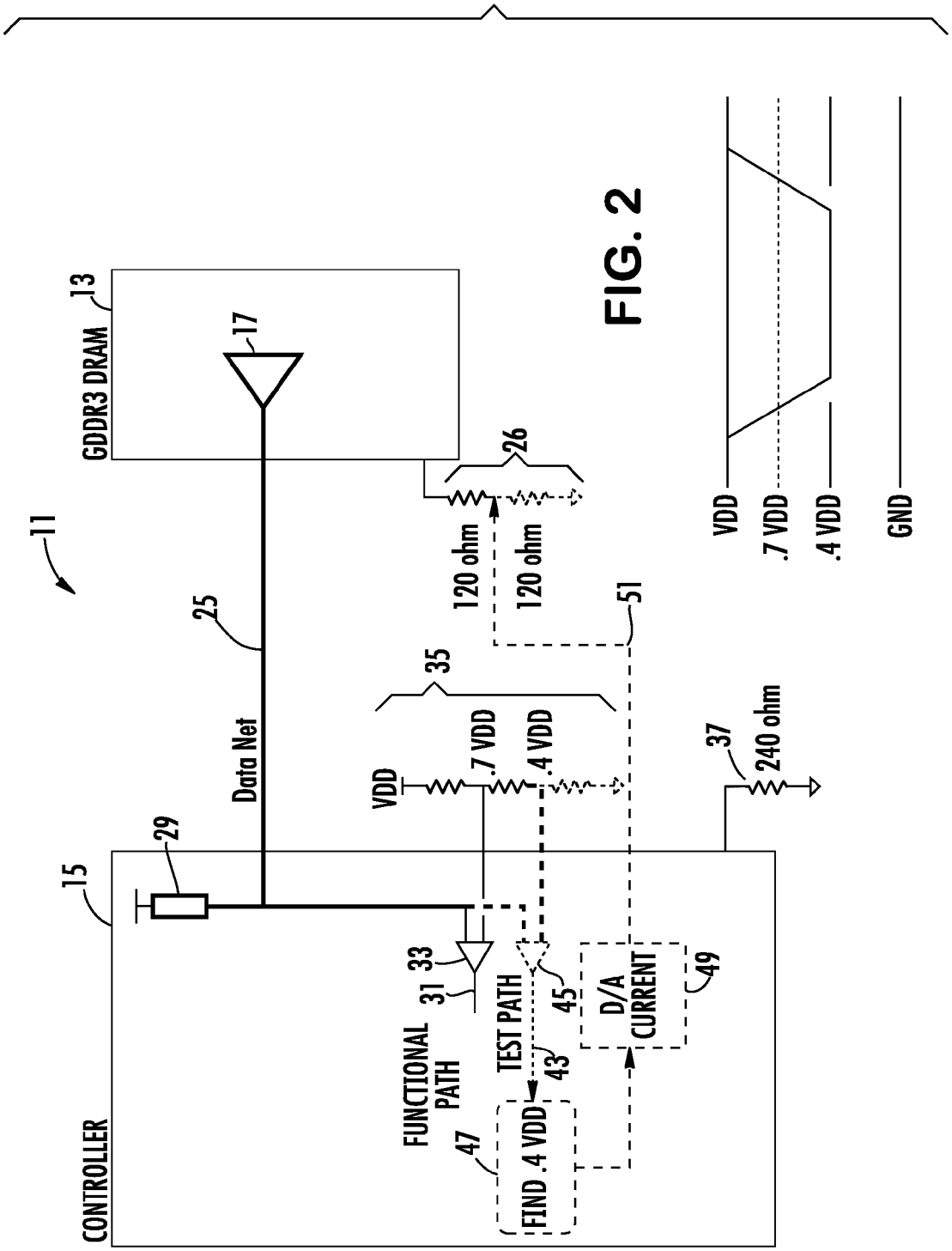
FIG. 2 is a schematic diagram of one embodiment of the invention for coupling a memory device and memory controller during driver training to reduce mismatches.

Another embodiment of the invention is depicted generally by the system 11 as illustrated in FIG. 2. GDDR3 DRAM 13 includes a driver 17 which drives data net 25 connected to termination 29 of the memory controller 15. When the GDDR3 DRAM 13 drives a 0 bit level value (reading a "0"), i.e., the DRAM 13 driver 17 is initialized by setting a "0" bit, the impedance of both the DRAM driver 17 and controller 15 termination determines what the voltage of the "0" level will be on the data net 25. In order to obtain the greatest timing margin on the data interface through the data net 25, embodiments address calibrating the DRAM driver 17 with an offset from the controller 15.

In the embodiment shown in FIG. 2, the impedance of the driver 17 at the GDDR3 memory device 13 is modified so that the predetermined reference voltage is at the vertical center of the read data eye to obtain the maximum timing margin. No modification is required to the GDDR3 DRAM 13.

In this exemplary embodiment, the controller 15 reference voltage is already set through a resistor arrangement 35. The resistor arrangement 35 is connected to a comparator 33 leading to a functional test path 31 in the controller 15. The resistor arrangement 35 also drives a predetermined voltage "0," e.g., 0.4 VDD, through a connection to a comparator 45 leading to a test path 43 of the controller 15. The comparator 45 is also connected to the data net 25 and receives the initialized 0 level voltage.

The controller 15 is programmed to adjust the voltage on the test path 43 to find the predetermined "0" voltage level. A detector 47 then provides an indication to a current module 49. The current module 49 may set a current based on the predetermined voltage of a "0" level on a connection 51 to a resistor connector combination 26 of the GDDR DRAM 13. When the current is applied on connection 51 to the memory device 13, the driver 17 is calibrated. That is, the voltage on the data net 25 is set at the predetermined level by adjustment caused by the current applied to connection 51.

Figure 3:
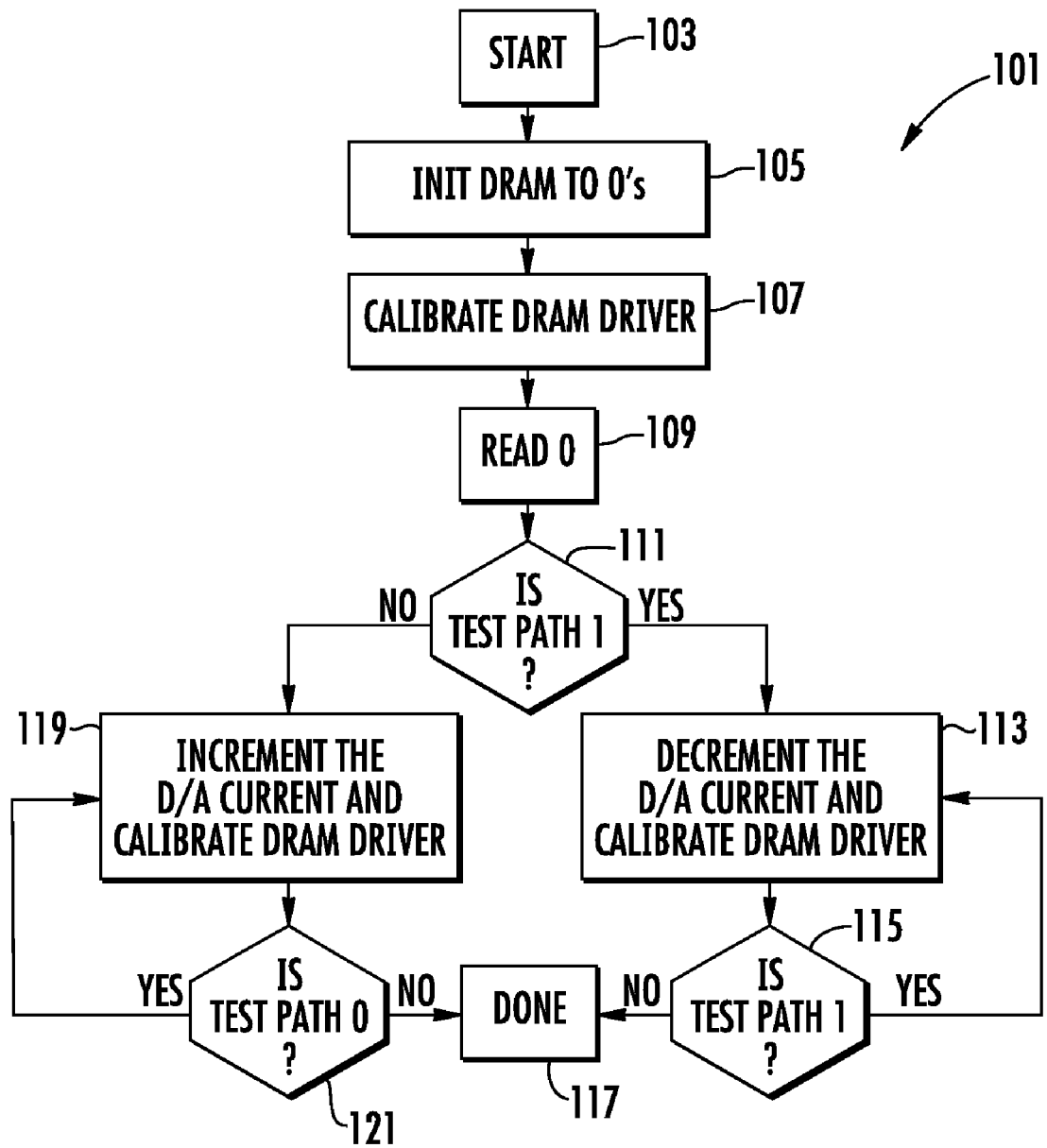
FIG. 3 is a flow diagram illustrating the operation during matching of the memory controller and the memory device of FIG. 2.

Processes for calibrating the DRAM driver in accordance with a system such as that of FIG. 2 are illustrated in greater detail in the flow chart 101 of FIG. 3. The exemplary method commences at step 103 of FIG. 3. A portion (or all) of the DRAM's data is initialized (or written) to all "0's" at step 105. The DRAM driver 17 is calibrated at step 107 by having the controller 15 read the 0 level voltage 109 on the data net 25. The test path 43 is tested at step 111 to determine if it is set at a 1 level voltage. If so, the DRAM driver impedance is too high, and the D/A current is decremented at step 113 to calibrate the DRAM driver 17. The test path is again tested at step 115. If the voltage is still at a level 1, the decrementing process is repeated until it is no longer a 1, and the process ends concludes at step 117.

If the test path is not a 1, then the DRAM driver impedance is too low. The D/A current is incremented, and the DRAM driver is calibrated. The test path is again checked at step 121. If the voltage is still at a 0 level, the D/A current is again incremented until the test path is no longer at a 0 level. At this point the process ends at step 117.

Changing the DRAM's drive impedance changes the 0 level voltage seen by the controller 15. A network of resistors provides a predetermined reference voltage 0.7 VDD and a predetermined voltage of a "0" level 0.4 VDD. In accordance with the exemplary method, the sending device, i.e., the memory device 13 is adjusted through altering the effective value of the calibration resistance to the memory device 13. The voltage on the test path 43 may be monitored until a predetermined "0 level voltage 0.4 VDD is seen on the data net 25, which is optimum for the predetermined 0.7 VDD reference voltage.

In accordance with an aspect of the invention, other application variables may play a role in the optimal training of the interface on the data net 25 relative to appropriate high, low and Vref values, or to termination strengths that determine the various levels. The driver and termination impedances may vary with temperature and/or voltage level variation associated with activity on other system or sub-system resources. Calibration for many of these methods may either be repeated as conditions change for maintenance of optimal settings and performance, or unique settings may be saved for different conditions if desired.

In an exemplary situation, a temperature change of greater than 20 degrees centigrade, or some other present value from the original or last calibration may initiate a new calibration. Alternatively, such an occurrence may initiate the loading of an alternate set of previously stored calibration values associated with the new temperature. Such processes may apply for variations associated with activation or deactivation of other system resources. Although shown for a GDDR3 device and memory controller sub-system, one of ordinary skill in the art will appreciate that such techniques can be applied to other industry standard or proprietary interfaces without deviating from the concepts disclosed above.

While the present invention has been illustrated by a description of various embodiments and while these embodiments have been described in considerable detail, it is not the intention of the applicants to restrict, or in any way to limit the scope of the appended claims to such detail. The invention in its broader aspects is therefore not limited to the specific details, representative apparatus and method, and illustrative example shown and described. Accordingly, departures may be made from such details without departing from the spirit or scope of Applicant's general inventive concept.

What is claimed is:

1. A method calibrating a driver of a memory device connected to a memory controller in an electrical communication bus, comprising:

connecting a memory device in an electrical communication bus with a corresponding memory controller during training of the drive impedance of the memory device;

initializing a 0 bit level voltage on the communication bus with a memory device driver;

applying said 0 bit level voltage to a test path of the memory controller, and adjusting said 0 bit level voltage to a predetermined level;

applying a current based on the predetermined level voltage to a resistor arrangement connected to the memory device; and setting said predetermined level voltage at the 0 bit level voltage on the communication bus.

2. The method of claim 1, wherein said predetermined level voltage is 0.4 VDD.

3. The method of claim 1, wherein said resistor arrangement is a pair of resistors.

4. The method of claim 1, further comprising applying a reference voltage to a functional path of the memory controller.

5. The method of claim 1, wherein said predetermined level voltage is used to drive a current into said resistor arrangement connected to the memory device.

6. The method of claim 1, wherein said memory device is a GDDR3 DRAM.

7. The method of claim 1, wherein a termination device and a driver of said controller are connected to said test path of said controller during adjustment of said 0 bit level voltage.

8. The method of claim 1, wherein said memory device has a reference voltage applied thereto during driver training.

9. The method of claim 1, wherein said memory device driver has a termination device connected thereto.

10. A coupled memory controller and memory device in an electrical communication bus, comprising:
   a first connection comprising a data net between a memory interface of the memory controller to the memory device, connecting a driver of the memory device to the memory controller for having the driver of the memory device initialize a 0 bit level voltage on the connection; and
   a test path in the memory controller connected to a second connection between the memory device and the memory controller, and to a resistor arrangement of the memory device for applying a current to the memory device to adjust the 0 bit level voltage to a predetermined level on the data net during memory device driver training.

11. The system of claim 10, wherein said memory device is a GDDR3 DRAM.

12. The system of claim 11, wherein said memory controller is programmed for adjusting the voltage applied to the test path, and further comprising a detector on the test path to detect a voltage therein.

13. The system of claim 11, wherein said 0 bit level voltage is set at the test path at 0.4 VDD.

14. The system of claim 13, further comprising a current module on the test path for applying a current to said memory device resistor arrangement based on said 0.4 VDD 0 bit level voltage.

15. The system of claim 10, wherein said interface is connected to a functional path of said memory controller.

16. The system of claim 15, further comprising a resistor arrangement connected for applying a reference voltage to a functional path of said memory controller.

17. The system of claim 10, wherein said resistor arrangement at said memory device is a matched pair of resistors.

18. The system of claim 10, wherein said driver of said memory device has a termination device connected thereto.

19. A coupled memory controller and memory device on an electrical communication bus, comprising:
   a first connection between a memory interface of the memory controller to the memory device connecting a driver of the controller to a driver of the memory device on a data net for having the driver of the memory device initialize a 0 bit level voltage on the interface;
   a functional path of the memory controller connected to the memory controller driver and to a reference voltage source;
   a test path of the memory controller connected to the interface for having said initialized 0 bit level voltage applied thereon, and connected to a voltage supply, said test path further adapted for adjusting a voltage thereon, and comprising a detector for detecting when a voltage thereon is adjusted to a predetermined level, and having a current module for setting a current on the test path set based on said adjusted predetermined level voltage; and
   a resistor arrangement connected to said memory device and to the test path for having the current from said current module applied thereto, for having the driver of said memory device set the 0 bit level voltage at the interface at said predetermined level voltage.

20. The system of claim 19, wherein said memory device is a GDDR3 DRAM.

* * * * *